(12) United States Patent
Son

(10) Patent No.: US 7,279,256 B2
(45) Date of Patent: Oct. 9, 2007

(54) PHOTORESIST POLYMER AND PHOTORESIST COMPOSITION CONTAINING THE SAME

(75) Inventor: Min Seok Son, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 193 days.

(21) Appl. No.: 11/124,762

(22) Filed: May 9, 2005

(65) Prior Publication Data

US 2006/0022297 A1    Feb. 2, 2006

(30) Foreign Application Priority Data

Jul. 30, 2004    (KR) .................. 10-2004-0060266

(51) Int. Cl.
*G03F 7/004* (2006.01)
(52) U.S. Cl. ............ 430/18; 430/270.1; 430/326; 430/330; 430/905; 430/910
(58) Field of Classification Search .......... 430/18, 430/20.1, 326, 330, 905, 910
See application file for complete search history.

(56) References Cited

U.S. PATENT DOCUMENTS

| | | | |
|---|---|---|---|
| 5,843,624 A * | 12/1998 | Houlihan et al. | 430/296 |
| 6,210,856 B1 | 4/2001 | Lin et al. | |
| 6,653,048 B2 * | 11/2003 | Brock et al. | 430/270.1 |
| 6,677,100 B2 * | 1/2004 | Kim et al. | 430/270.1 |
| 6,780,563 B2 * | 8/2004 | Hasegawa et al. | 430/270.1 |
| 6,844,134 B2 * | 1/2005 | Choi et al. | 430/270.1 |
| 2005/0244748 A1 * | 11/2005 | Son | 430/270.1 |

FOREIGN PATENT DOCUMENTS

KR    10-2001-0011768 A    2/2001

(Continued)

*Primary Examiner*—John S. Chu
(74) *Attorney, Agent, or Firm*—Marshall, Gerstein & Borun LLP

(57) ABSTRACT

Photoresist polymers and photoresist compositions are disclosed. A photoresist polymer comprising a polymerization repeating unit represented by Formula I is less sensitive to change in the amount of energy due to its higher active energy than that of a conventional photoresist polymer. As a result, a phenomenon where the portion of the pattern for the storage electrode contact region that receives relatively large amount of light becomes too thin is avoided when the device isolation film pattern is formed, and wherein pattern collapse caused by a high aspect ratio due to high etching resistance is prevented or avoided.

Formula 1

$$-\left(\begin{array}{c}H_2\\C\end{array}\begin{array}{c}R_1\\ \\ \\ \\ O\\ \\O\\ \\R_3\\ \\ \\Si\\R_4\quad R_6\\ \\R_5\end{array}\right)_a\left(\begin{array}{c}H_2\\C\end{array}\begin{array}{c}R_2\\ \\ \\ \\ O\\ \\O\\ \\R_7\quad R_9\\ \\R_8\end{array}\right)_b\left(\begin{array}{c}\\ \\ \\ \\ \\ \\ \\ \\O\\ \\O\\ \\R_{10}\end{array}\right)_c\left(\begin{array}{c}O\\ \\ \\O\\ \\ \\O\end{array}\right)_d$$

wherein $R_1$–$R_{10}$, a, b, c and d are as defined in the description.

20 Claims, 2 Drawing Sheets

FOREIGN PATENT DOCUMENTS

| | | |
|---|---|---|
| KR | 2001-11768 | 2/2001 |
| KR | 10-2004-0000518 A | 1/2004 |
| KR | 10-2005-0002384 A | 1/2005 |
| KR | 10-2006-0011423 A | 2/2006 |
| WO | 02/084402 A2 | 10/2002 |

* cited by examiner

PHOTORESIST POLYMER AND PHOTORESIST COMPOSITION CONTAINING THE SAME

BACKGROUND

1. Technical Field

Photoresist polymers and photoresist compositions containing the same are disclosed that can avoid a phenomenon where a pattern of a storage electrode contact region that receives a relatively large amount of light becomes too thin when a device isolation film pattern is formed. The photoresist polymers and compositions can also prevent pattern collapse caused by a high aspect ratio by improving the etching resistance.

2. Description of the Related Art

As a manufacturing process of a semiconductor device becomes more complicated and the degree of integration is increased, methods for forming fine patterns are needed. Because it is difficult to obtain a fine pattern with conventional photolithography using KrF (248 nm), photolithography using a far-infrared light source such as ArF (193 nm) has been developed. However, photoresist materials that have been used in ArF photolithography are more difficult to use than conventional photoresist materials. Specifically, as the critical dimension CD has been decreased by high integration, the aspect ratio of a pattern is increased which causes collapse of the photoresist pattern 12 on the semiconductor substrate 11 as shown in FIG. 1.

Semiconductor device manufacturing processes include over 100 steps. One basic step is the formation of the device isolation film. When the device isolation film pattern is formed, the same amount of light energy is irradiated on the entire field. However, a storage electrode contact region receives a relatively large amount of light due to the shape the device isolation film pattern around the electrode contact. As a result, the photoresist film is reduced in this area and the storage electrode contact region becomes thinner. Although the amount of energy or exposure conditions of lens have been regulated in order to prevent the storage electrode contact region from being too thin, the above-described problems have not been solved.

In addition, there are problems in that the margins of DOF (Depth of Focus) and EL (Energy Latitude) become smaller as the pattern becomes smaller. However, these problems cannot be solved by changing the exposure conditions. Also, it is difficult to secure etching resistance because the thickness of the photoresist film becomes too thin to prevent pattern collapse.

SUMMARY OF THE DISCLOSURE

Disclosed herein are photoresist polymers and photoresist compositions containing the same that can improve a profile of a storage electrode contact region which receives relatively large amount of light when a device isolation film pattern is formed and developed and wherein the photoresist polymers and compositions also provide good etching resistance.

Disclosed herein are methods for forming photoresist patterns using the disclosed photoresist compositions. Also, disclosed herein are semiconductor devices obtained by the disclosed methods.

BRIEF DESCRIPTION OF THE DRAWINGS

For a more complete understanding of this disclosure, reference should be made to the following detailed description and accompanying drawings wherein.

DETAILED DESCRIPTION OF THE PRESENTLY PREFERRED EMBODIMENTS

Figure 1:
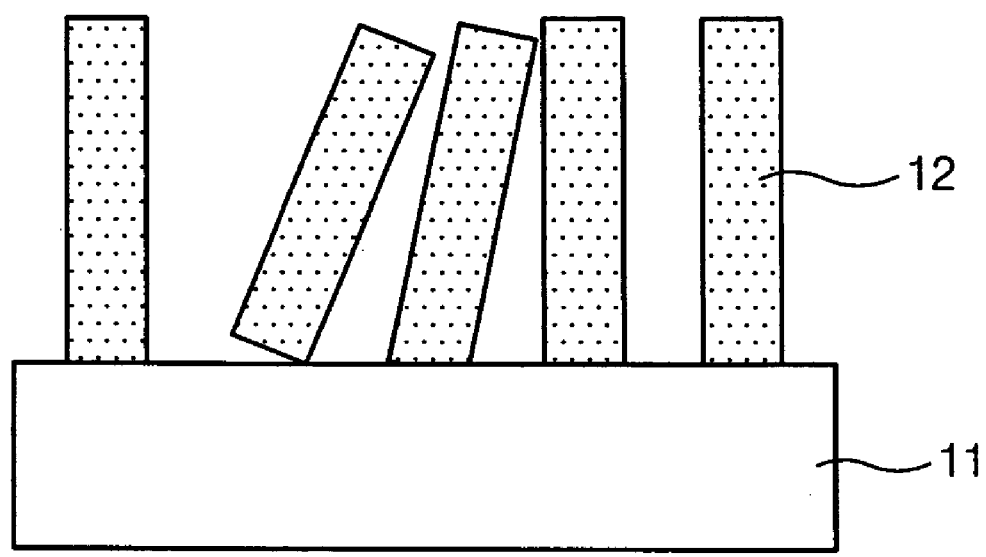
FIG. 1 is a diagram illustrating a pattern formed using a conventional photoresist polymer.

One photoresist polymer comprises a polymerization repeating unit represented by Formula 1:

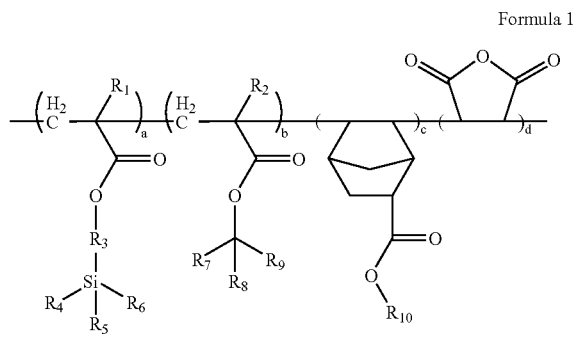

Formula 1 wherein $R_1$ and $R_2$ are individually H or $CH_3$;
$R_3$ is linear or branched $C_3$–$C_{10}$ alkylene group;
$R_4$, $R_5$ and $R_6$ are individually $C_1$–$C_3$ alkoxy group;
$R_7$, $R_8$ and $R_9$ are individually H or $CH_3$;
$R_{10}$ is linear or branched $C_1$–$C_3$ alkyl group; and
a ratio of a:b:c:d falls within the range of 20~40 mol %: 20~35 mol %: 15~25 mol %: 15~20 mol %.

The polymer has a molecular weight ranging from 1,000 to 10,000, more preferably from 1,500 to 4,000.

The polymerization repeating unit represented by Formula 1 may be further represented by Formula 1a:

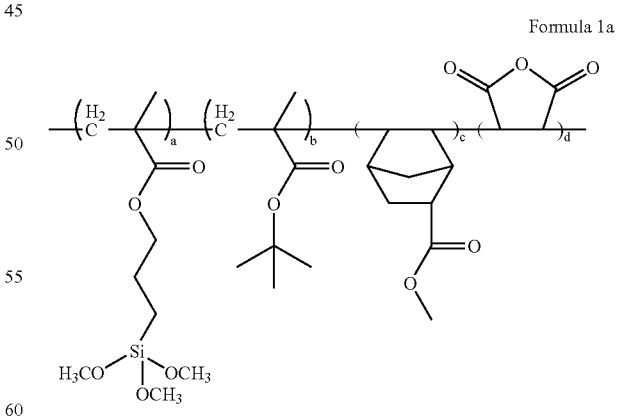

Formula 1a

In the disclosed photoresist polymer, a monomer consitituting the repeating unit "a" has a long chain by introducing linear or branched $C_3$–$C_{10}$ alkylene structure to prevent steric hindrance between end groups, thereby facilitating polymerization of polymers. Also, the monomer of the repeating unit "a" contains a large percentage of silicon and carbon to improve hardness of photoresist. Additionally, an increase in the etching resistance due to introduction of a silicon group allows a photoresist film having a lower thickness to serve as an etching mask in an etching process using a $CF_4$ plasma gas.

A monomer consitituting the repeating unit "b" comprises a methyl group added in a basic structure to improve the etching resistance of the polymer, and has a strong cohesive force because connection of other carbons located adjacent to a COO— group is not linear. In the above-described monomer, since the phenomenon that the profile becomes too thin is alleviated as the amount of light becomes larger due to its high active energy, sensitivity becomes lower to change of various exposure conditions.

If the disclosed photoresist polymer is used, collapse of patterns can be prevented or avoided even when the thickness of ArF photoresist is formed at below 4,000 Å to lower the aspect ratio. Additionally, the etching resistance is increased by a hardened layer, thereby facilitating formation of a pattern of a bottom underlying layer. As a result, a pattern having a high resolution can be formed.

The disclosed photoresist polymer can be prepared using a radical polymerization reaction which is performed with a bulk polymerization reaction or a solution polymerization reaction.

In the solution polymerization reaction, a polymerization solvent can be selected from the group consisting of tetrahydrofurane, cyclohexanone, cyclopentanone, dimethylformamide, dimethylsulfoxide, methylethylketone, dioxane, benzene, toluene, xylene and mixtures thereof.

Additionally, a polymerization initiator of the polymerization reaction is preferably selected from the group consisting of 2,2'-azobisisobutyronitrile (AIBN), benzoyl peroxide, acetylperoxide, laurylperoxide, t-butylperacetate, t-butylhydroperoxide, di-t-butylperoxide and mixtures thereof.

Also, photoresist compositions are disclosed which comprise the photoresist polymer of Formula 1, a photoacid generator and an organic solvent.

Any of conventional photoacid generators, which are able to generate acids when they are exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001).

Sulfide type or onium type compounds are mainly used for the photoacid generator. The photoacid generator having low absorbance at 157 nm and 193 nm is preferably used. The photoacid generator may be one or more compounds selected from the group consisting of phthalimidotrifluoromethane sulfonate, dinitrobenzyltosylate, n-decyl disulfone, naphthylimido trifluoromethane sulfonate, diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, and mixtures thereof.

Preferably, the photoacid generator is present in an amount ranging from 0.01 wt % to 5 wt % based on the photoresist polymer present. If the photoresist generator is present in the amount of less than 0.01 wt %, the photosensitivity of the photoresist composition to light can be too low. If the photoacid generator is present in the amount of more than 5 wt %, poor pattern formation due to its high absorption of far ultraviolet rays and the generation of excess acid can result.

Conventional organic solvents can be employed with the photoresist composition, and some of the conventional solvents are also disclosed in the documents described above. Preferably, the organic solvent is selected from the group consisting of diethyleneglycoldiethylether, methyl 3-methoxypropionate, ethyl 3-ethoxypropionate, propyleneglycol methyletheracetate, cyclohexanone, 2-heptanone, ethyl lactate and mixtures thereof. The organic solvent is present in an amount ranging from 100 wt % to 1,500 wt % based on the photoresist polymer.

A disclosed method for forming a photoresist pattern, comprises:

(a) forming a photoresist film by coating the disclosed photoresist composition;

(b) soft-baking the photoresist film;

(c) exposing the baked photoresist film to light;

(d) post-baking the exposed photoresist film; and (e) developing the resulting structure to obtain a photoresist pattern.

In step (a), the thickness of the photoresist film preferably ranges from 1,500 Å to 3,000 Å. The soft baking process of step (b) is performed at a temperature ranging from 80° C. to 150° C., preferably from 60° C. to 120° C. Preferably, the post baking process of step (d) is performed at a temperature ranging from 90° C. to 200° C.

The exposure process of step (c) is performed using the light selected from the group consisting of I-line (365 nm), KrF (248 nm), ArF (193 nm), $F_2$ (157 nm), EUV (13 nm), E-beam, X-ray and ion beam with an exposure energy ranging from 1 $mJ/cm^2$ to 100 $mJ/cm^2$.

The developing process of step (e) is preferably performed using an alkaline developing solution such as TMAH aqueous solution in an amount ranging from 0.01 to 5 wt %, preferably about 2.38 wt %.

The underlying layer is preferably selected from the group consisting of an oxide film such as BPSG (boron phosphorous silicate glass; a nitride film; a metal film such as aluminum, tungsten, cobalt or titanium; an organic anti-reflective coating film; and an inorganic anti-reflective coating film.

Figure 2:
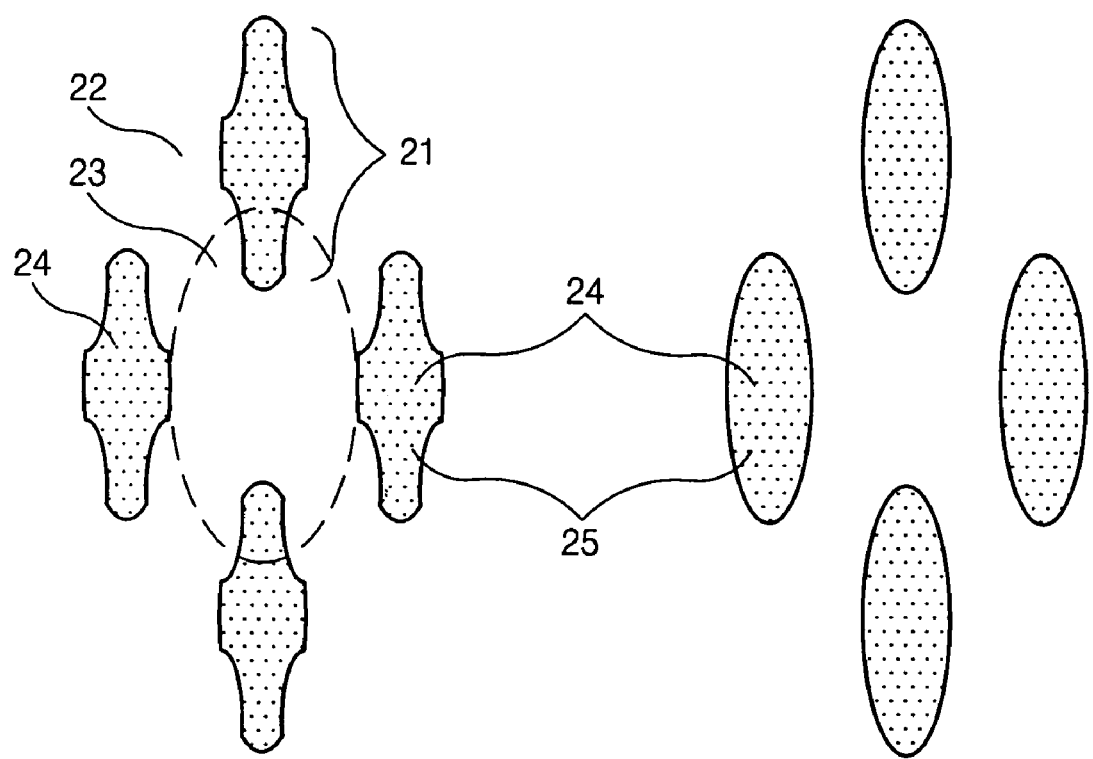
FIG. 2 is a diagram illustrating a process for obtaining an improved device isolation film pattern using a disclosed photoresist polymer.

Referring to FIG. 2, when a common ArF photoresist is used, a site 23 which receives a large amount of light in a device separating region 22 relatively receives a large amount of energy, so that a pattern of a storage electrode contact region 25 becomes too thin. However, said pattern does not become too thin when the disclosed photoresist composition is used.

The disclosed photoresist polymer can prevent pattern collapse generated when the width of the pattern becomes narrower and the aspect ratio becomes larger because even a photoresist film having a thin thickness serves as an etching mask due to increase of the etching resistance by introduction of a silicon group.

Also, there is provided a semiconductor device manufactured by using the disclosed method for forming the photoresist pattern.

The disclosed photoresist polymers and photoresist compositions containing the same will be described in greater detail by referring to examples below, which are not intended to be limiting.

EXAMPLE 1

Preparation of Photoresist Polymer

To 25 ml of tetrahydrofuran in 100 ml of a round-shaped flask were added 5 g of 3-(trimethoxysilyl)propyl methacrylate, 4 g of t-butyl methacrylate, 3 g of methyl 5-norbornene-2-carboxylate and 3 g of maleic anhydride. Then, 0.13 g of AIBN (azobisisobutyronitrile) as a polymerization initiator was added to the resulting mixture, and reacted at 67° C. under a nitrogen atmosphere for 24 hours. Next, the resulting mixture was cooled at room temperature, and poured into a beaker including 500 ml of ethyl ether to precipitate the resulting mixture. Thereafter, the precipitate was filtered and dehydrated at room temperature, thereby obtaining poly(3-(trimethyoxysilyl)propyl methacrylate/t-butyl methacrylate/methyl 5-norbornene-2-carboxylate/maleic anhydride) having a molecular weight of 1,800 represented by formula 1a (yield: 50%).

EXAMPLE 2

Preparation of Photoresist Composition

To 50 g of methyl 3-methoxypropionate as an organic solvent were added 10 g of poly(3-(trimethyoxysilyl)propyl methacrylate/t-butyl methacrylate/methyl 5-norbornene-2-carboxylate/maleic anhydride) obtained from Example 1 and 0.1 g of triphenylsulfonium triflate as a photoacid generator. Then, the resulting mixture was filtered through a 0.10 μm filter to obtain a disclosed photoresist composition.

EXAMPLE 3

Formation of Photoresist Patterns

The photoresist composition obtained from Example 2 was spin-coated on a silicon wafer to form a photoresist film, and soft-baked at 90° C. for 90 seconds. After baking, the photoresist was exposed to light using a KrF laser exposer, and then post-baked at 110° C. for 90 seconds. The baked wafer was developed in 2.38 wt % TMAH aqueous solution for 40 seconds to obtain a L/S pattern of 120 nm.

As described above, since the disclosed photoresist polymer is less sensitive to change in the amount of energy due to its higher active energy than that of a conventional photoresist polymer, a phenomenon that a pattern of a storage electrode contact region that receives a relatively large amount of light can be improved when a device isolation film pattern is formed, and pattern collapse caused by a high aspect ratio due to high etching resistance can be prevented. Therefore, the disclosed photoresist polymers and the photoresist compositions containing the same facilitate processes because the range of energy which can be applied to a process margin becomes broader, and represent the more improved resolution.

What is claimed is:

1. A photoresist polymer comprising a polymerization repeating unit represented by Formula 1:

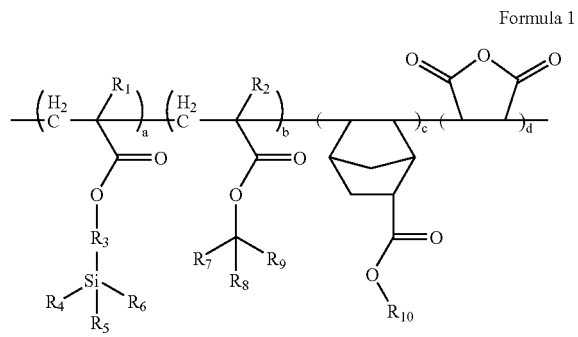

Formula 1 wherein $R_1$ and $R_2$ are individually H or $CH_3$;

$R_3$ is linear or branched $C_3$–$C_{10}$ alkylene group;

$R_4$, $R_5$ and $R_6$ are individually $C_1$–$C_3$ alkoxy group;

$R_7$, $R_8$ and $R_9$ are individually H or $CH_3$;

$R_{10}$ is linear or branched $C_1$–$C_3$ alkyl group; and a ratio of a:b:c:d falls within a range of 20~40 mol %: 20~35 mol %: 15~25 mol %: 15~20 mol %.

2. The photoresist polymer according to claim 1, wherein the polymer has a molecular weight ranging from 1,500 to 4,000.

3. The photoresist polymer according to claim 1, wherein the polymerization repeating unit represented by Formula 1 is represented by Formula 1a:

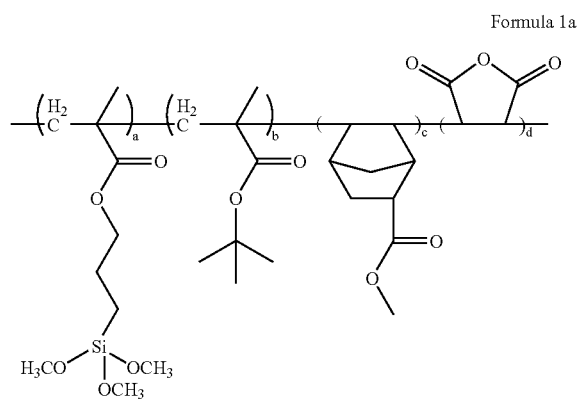

Formula 1a

4. A photoresist composition comprising the photoresist polymer described in claim 1, a photoacid generator and an organic solvent.

5. The photoresist composition according to claim 4, wherein the photoacid generator is one or more compounds selected from the group consisting of phthalimidotrifluoromethane sulfonate, dinitrobenzyltosylate, n-decyl disulfone, naphthylimido trifluoromethane sulfonate, diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, and mixtures thereof.

6. The photoresist composition according to claim 4, wherein the photoacid generator is present in an amount ranging from 0.01 wt % to 5 wt % based on the photoresist polymer.

7. The photoresist composition according to claim 4, wherein the organic solvent is selected from the group consisting of diethyleneglycoldiethylether, methyl 3-methoxypropionate, ethyl 3-ethoxypropionate, propyleneglycol methyletheracetate, cyclohexanone, 2-heptanone, ethyl lactate and mixtures thereof.

8. The photoresist composition according to claim 4, wherein the organic solvent is present in an amount ranging from 100 wt % to 1,500 wt % based on the photoresist polymer.

9. A method for forming a photoresist pattern, comprising:
   (a) forming a photoresist film by coating the photoresist composition of claim 4 on an underlying layer;
   (b) soft-baking the photoresist film;
   (c) exposing the baked photoresist film to light;
   (d) post-baking the exposed photoresist film; and
   (e) developing the resulting structure to obtain a photoresist pattern.

10. The method according to claim 9, wherein the soft baking process of step (b) is performed at a temperature ranging from 80° C. to 150° C.

11. The method according to claim 9, wherein the light of step (c) is selected from the group consisting of I-line (365 nm), KrF (248 nm), ArF (193 nm), $F_2$ (157 nm), EUV (13 nm), E-beam, X-ray and ion beam.

12. The method according to claim 9, wherein the exposing process of step (c) is performed at an exposure energy ranging from 1 $mJ/cm^2$ to 100 $mJ/cm^2$.

13. The method according to claim 9, wherein the post baking process of step (d) is performed at a temperature ranging from 90° C. to 200° C.

14. A semiconductor device manufactured using the method of claim 9.

15. A semiconductor device manufactured using the method of claim 10.

16. A semiconductor device manufactured using the method of claim 11.

17. A semiconductor device manufactured using the method of claim 12.

18. A semiconductor device manufactured using the method of claim 13.

19. A photoresist composition comprising the photoresist polymer of claim 2, a photoacid generator and an organic solvent.

20. The photoresist composition of claim 19, wherein the photoacid generator is one or more compounds selected from the group consisting of phthalimidotrifluoromethane sulfonate, dinitrobenzyltosylate, n-decyl disulfone, naphthylimido trifluoromethane sulfonate, diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, and mixtures thereof, and wherein the organic solvent is selected from the group consisting of diethyleneglycoldiethylether, methyl 3-methoxypropionate, ethyl 3-ethoxypropionate, propyleneglycol methyletheracetate, cyclohexanone, 2-heptanone, ethyl lactate and mixtures thereof.

* * * * *